US010982350B2

(12) United States Patent
Narushima et al.

(10) Patent No.: US 10,982,350 B2
(45) Date of Patent: *Apr. 20, 2021

(54) SILICON MONOCRYSTAL PRODUCTION METHOD

(71) Applicant: SUMCO CORPORATION, Tokyo (JP)

(72) Inventors: Yasuhito Narushima, Tokyo (JP); Toshimichi Kubota, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 85 days.

This patent is subject to a terminal disclaimer.

(21) Appl. No.: 16/311,493

(22) PCT Filed: Apr. 26, 2017

(86) PCT No.: PCT/JP2017/016492
§ 371 (c)(1),
(2) Date: Dec. 19, 2018

(87) PCT Pub. No.: WO2018/003264
PCT Pub. Date: Jan. 4, 2018

(65) Prior Publication Data
US 2019/0186042 A1    Jun. 20, 2019

(30) Foreign Application Priority Data
Jun. 27, 2016 (JP) .............................. JP2016-126461

(51) Int. Cl.
*C30B 15/02* (2006.01)
*C30B 29/06* (2006.01)
(Continued)

(52) U.S. Cl.
CPC .............. *C30B 29/06* (2013.01); *C30B 15/04* (2013.01); *C30B 15/22* (2013.01)

(58) Field of Classification Search
CPC ......... C30B 15/00; C30B 15/02; C30B 15/10; C30B 29/04
See application file for complete search history.

(56) References Cited

U.S. PATENT DOCUMENTS 5,827,366 A * 10/1998 Watanabe ............... C30B 15/30
117/202
6,913,647 B2 * 7/2005 Falster .................... C30B 29/06
117/13
(Continued)

FOREIGN PATENT DOCUMENTS

CN      104357901 A     2/2015
CN      105063750 A     11/2015
(Continued)

OTHER PUBLICATIONS

U.S. Appl. No. 16/310,232 to Yasuhito Narushima et al., which was filed Dec. 14, 2018.

(Continued)

*Primary Examiner* — Robert M Kunemund
(74) *Attorney, Agent, or Firm* — Greenblum & Bernstein, P.L.C.

(57) ABSTRACT

A production method of a monocrystalline silicon includes: forming a shoulder of the monocrystalline silicon; and forming a straight body of the monocrystalline silicon. In forming the shoulder, the shoulder is formed such that a part of growth striations, which extend radially across the shoulder, has an outer end interrupted by another part of the growth striations not to reach a peripheral portion of the shoulder and that no remelt growth area with a height of 200 µm or more in a growth direction is generated.

4 Claims, 11 Drawing Sheets

(51) Int. Cl.
    *C30B 15/22*     (2006.01)
    *C30B 15/04*     (2006.01)

(56) References Cited

U.S. PATENT DOCUMENTS

| | | | |
|---|---|---|---|
| 7,229,693 B2 * | 6/2007 | Falster | C30B 15/203 |
| | | | 117/932 |
| 10,227,710 B2 | 3/2019 | Narushima et al. | |
| 10,233,564 B2 * | 3/2019 | Narushima | C30B 15/22 |
| 2002/0000188 A1 | 1/2002 | Weber et al. | |
| 2009/0301385 A1 | 12/2009 | Kuroki et al. | |
| 2011/0214603 A1 | 9/2011 | Minami | |
| 2014/0109824 A1 | 4/2014 | Hwang et al. | |
| 2017/0327966 A1 | 11/2017 | Narushima et al. | |
| 2019/0249331 A1 | 8/2019 | Narushima et al. | |

FOREIGN PATENT DOCUMENTS

| | | |
|---|---|---|
| DE | 100 25 870 A1 | 12/2001 |
| DE | 11 2012 005 584 T5 | 10/2014 |
| DE | 11 2017 003 016 T5 | 3/2019 |
| JP | H 03-137090 A | 6/1991 |
| JP | H5-208893 A | 8/1993 |
| JP | 2008-297167 A | 12/2008 |
| JP | 2011-201757 A | 10/2011 |
| WO | 2006/117939 A1 | 11/2006 |
| WO | WO 2017/217104 A1 | 12/2017 |

OTHER PUBLICATIONS

International Search Report issued in International Bureau of WIPO Patent Application No. PCT/JP2017/016492, dated Jul. 25, 2017, together with an English translation.
International Preliminary Report on Patentability issued in International Bureau of WIPO Patent Application No. PCT/JP2017/016492, dated Jan. 1, 2019, together with an English translation.
Office Action for CN App. No. 201780040309.5, dated Aug. 14, 2020 (w/ translation).
Office Action for DE App. No. 11 2017 003 197.4, dated Feb. 1, 2021 (w/ translation).

* cited by examiner

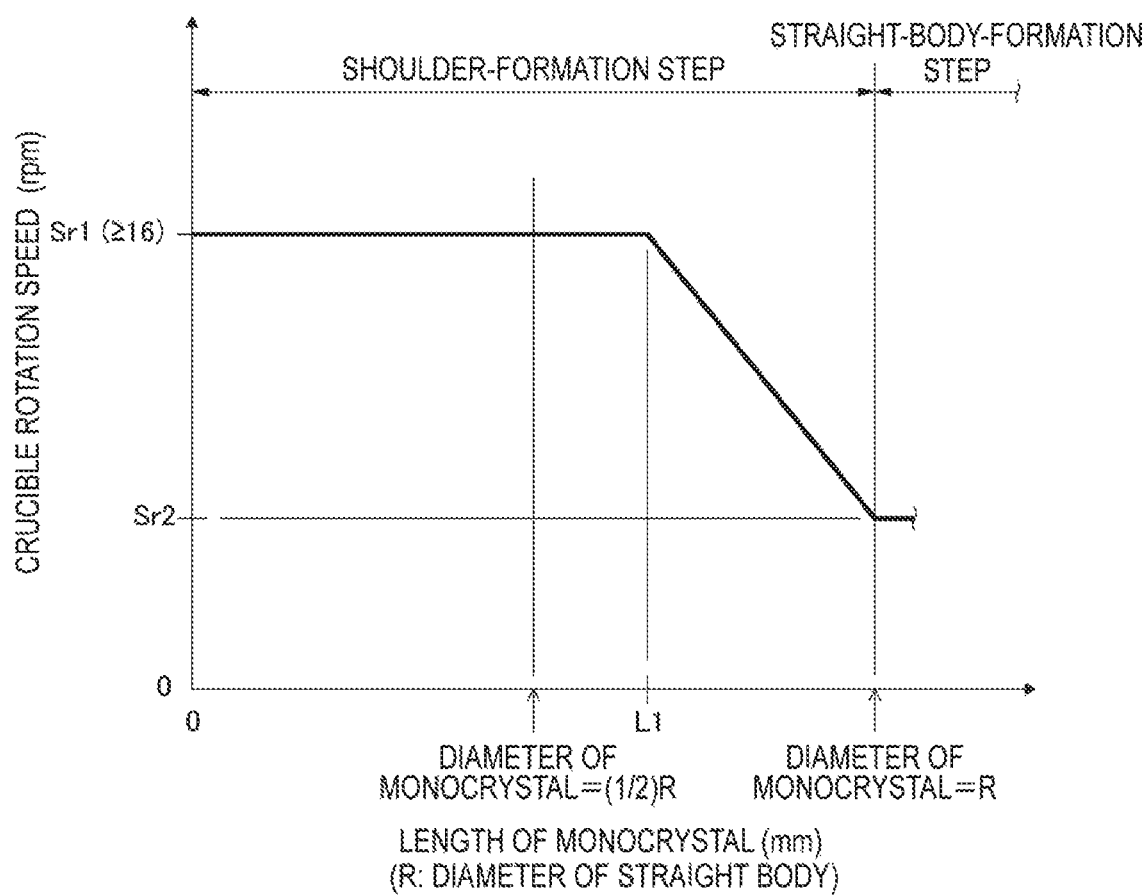

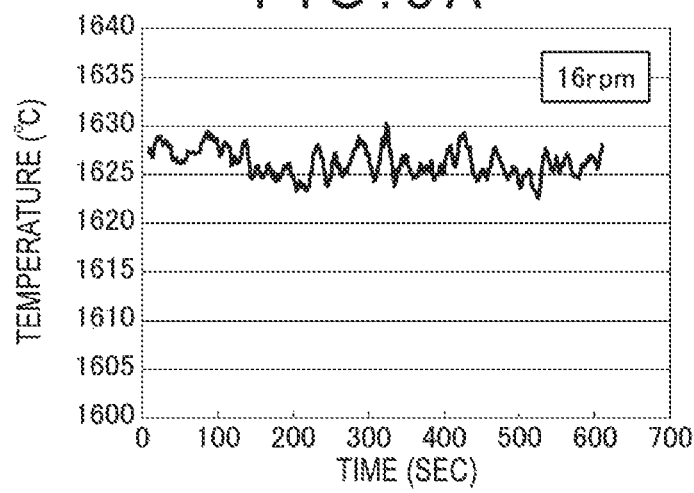
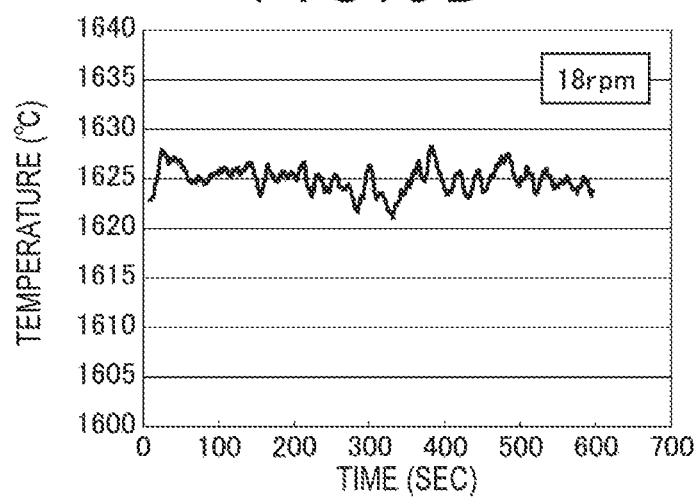
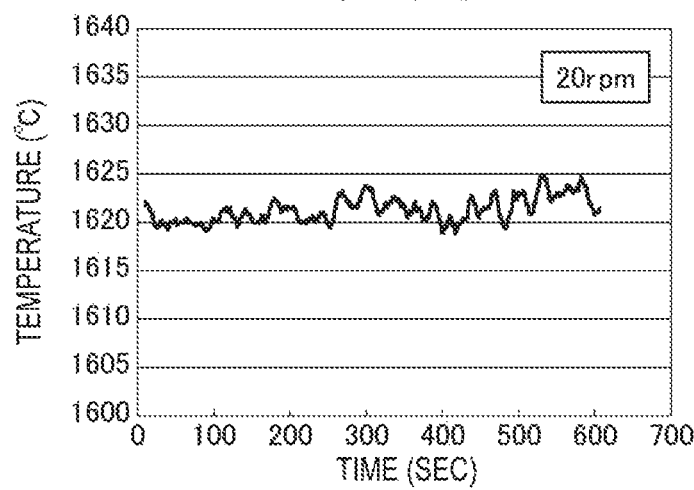

SILICON MONOCRYSTAL PRODUCTION METHOD

TECHNICAL FIELD

The present invention relates to a production method of a monocrystalline silicon.

BACKGROUND ART

Low-resistive monocrystalline silicons have recently been demanded. In a known production method of such monocrystalline silicons where an n-type dopant is densely added, single crystallization is sometimes hampered and thus studies have been conducted on prevention of such a problem (see, for instance, Patent Literature 1).

Patent Literature 1 discloses that addition of a large amount of the dopant significantly increases a freezing-point depression to cause compositional supercooling and an abnormal growth (Cell growth), which is different from a silicon growth on a silicon growth face, is induced on a crystal growth interface when such compositional supercooling is large, hampering single crystallization.

According to the production method of Patent Literature 1, which takes into account that a temperature gradient in a silicon melt cannot be directly measured, a monocrystalline silicon is produced such that a predetermined relationship is satisfied between a temperature gradient of the monocrystalline silicon, which is referred to instead of the temperature gradient in the silicon melt, a dopant concentration in the silicon melt, a pull-up speed, and a coefficient corresponding to a dopant type.

CITATION LIST

Patent Literature(s)

Patent Literature 1 JP 2008-297167 A

SUMMARY OF THE INVENTION

Problem(s) to be Solved by the Invention

However, dislocation sometimes occurs at an early stage of crystal growth in the process of producing the monocrystalline silicon to hamper single crystallization, which has proven that the method of Patent Literature 1 cannot always prevent the problem.

An object of the invention is to provide a monocrystalline silicon production method capable of producing a monocrystalline silicon with a stable quality.

Means for Solving the Problem(s)

After dedicated studies, the inventors have found the following.

Growth striations are formed inside a monocrystalline silicon. The growth striations are not in a planar shape but a curved shape in conformity with a shape of a solid-liquid interface obtained in the process of producing a monocrystalline silicon (e.g. a curved shape dented upward at a center). When a surface temperature of the silicon melt in the vicinity of the monocrystalline silicon is stable, the growth striations are substantially the same in shape.

However, a surface of the silicon melt is subjected to not only convection of the silicon melt but also factors that make the temperature unstable, such as heat extraction by purge gas and vaporization heat resulting from evaporation of the dopant. When a silicon melt with a high temperature enters the solid-liquid interface due to an unstable surface temperature of the silicon melt, the monocrystalline silicon is melted (remelted) and again hardened to generate curved growth striations that are, for instance, dented downward at a center. Consequently, as shown in FIG. 1, it has been found that a remelt growth area A is formed between a lowermost growth striation P1 of upwardly dented growth striations that extend radially across a shoulder and an uppermost growth striation P2 of downwardly dented growth striations below the growth striation P1 and in a peripheral portion of the shoulder of a monocrystalline silicon SM.

Further, as a result of studies on a relationship between the generation of the remelt growth area A and the occurrence of dislocation, it has been found that the remelt growth area A having a maximum value of height H (hereinafter simply referred to as "height") of 200 μm or more is generated with the occurrence of dislocation in the shoulder and consequent dislocation in a straight body. In contrast, it has been found that when the remelt growth area A with the height H of 200 μm or more is not generated, no dislocation occurs in the shoulder and in the straight body.

The invention has been made in view of the above findings.

According to an aspect of the invention, a production method of a monocrystalline silicon according to a Czochralski process with use of a monocrystal pull-up apparatus, which includes: a chamber; a crucible located in the chamber; a heater configured to heat the crucible to produce a dopant-added melt comprising a silicon melt and a dopant added to the silicon melt; and a pull-up unit configured to pull up a seed crystal after bringing the seed crystal into contact with the dopant-added melt, includes: forming a shoulder of the monocrystalline silicon; and forming a straight body of the monocrystalline silicon. In forming the shoulder, the shoulder is formed such that a part of growth striations, which extend radially across the shoulder, has an outer end interrupted by another part of the growth striations not to reach a peripheral portion of the shoulder and that no remelt growth area with a height of 200 μm or more in a growth direction is generated.

In the above aspect, no dislocation occurs in the shoulder and the straight body, so that a monocrystalline silicon with a stable quality can be produced.

According to another aspect of the invention, a production method of a monocrystalline silicon according to a Czochralski process with use of a monocrystal pull-up apparatus, which includes: a chamber; a crucible located in the chamber; a heater configured to heat the crucible to produce a dopant-added melt comprising a silicon melt and red phosphorus or arsenic added as a dopant to the silicon melt; and a pull-up unit configured to pull up a seed crystal after bringing the seed crystal into contact with the dopant-added melt, includes: forming a shoulder of the monocrystalline silicon; and forming a straight body with a target diameter of 200 mm or more. In forming the shoulder, the crucible is rotated at 16 rpm or more.

Although a typical rotation speed of the crucible for the straight-body-formation step ranges from 2 rpm to 12 rpm, the crucible is rotated at a relatively high speed in the above aspect as described above, thereby reducing the convection of the silicon melt and, consequently, reducing variation in a temperature of the surface of the silicon melt. Such a simple adjustment of the speed of the crucible can reduce remelting due to destabilizing the temperature and, consequently, the generation of the remelt growth area A. Thus, no dislocation occurs in the shoulder and the straight body, so that a monocrystalline silicon with a stable quality can be produced.

In the above aspect, in forming the shoulder, the crucible is rotated at 16 rpm or more until a timing when a diameter of the shoulder being formed reaches a half of the target diameter of the straight body or more and a rotation speed of the crucible is reduced at or after the timing.

Similarly, in the straight-body-formation step, a rotation of the crucible at 16 rpm or more sometimes causes uneven in-plane distribution of, for instance, oxygen concentration and resistivity of the straight body, so that the rotation speed of the crucible for the straight-body-formation step needs to be reduced. However, when the rotation speed of the crucible starts being reduced at a timing before the diameter of the shoulder reaches the half of the target diameter of the straight body, the dislocation cannot be effectively reduced even by rotating the crucible at 16 rpm or more.

In the above aspect, the rotation speed of the crucible is controlled under the above conditions, reducing not only the dislocation in the straight body but also the uneven distribution of, for instance, oxygen concentration and resistivity.

According to still another aspect of the invention, a production method of a monocrystalline silicon according to a Czochralski process with use of a monocrystal pull-up apparatus, which includes: a chamber; a crucible located in the chamber; a heater configured to produce a dopant-added melt comprising a silicon melt and red phosphorus or arsenic added as a dopant to the silicon melt, the heater comprising an upper heater configured to heat an upper side surface of the crucible and a lower heater configured to heat a lower side surface of the crucible; and a pull-up unit configured to pull up a seed crystal after bringing the seed crystal into contact with the dopant-added melt, includes: forming a shoulder of the monocrystalline silicon; and forming a straight body with a target diameter of 200 mm or more. In forming the shoulder: the crucible is rotated at 14 rpm or more until a timing when a diameter of the shoulder being formed reaches a half of the target diameter of the straight body or more while heating the crucible such that a heating ratio, which is calculated by dividing a volume of heat from the lower heater by a volume of heat from the upper heater, increases from a predetermined value of 1 or more; and a rotation speed of the crucible is reduced at or after the timing while the heating ratio is maintained constant.

As described above, the surface of the dopant-added melt is subject to large heat extraction by purge gas and/or vaporization heat resulting from evaporation of the dopant, so that the liquid temperature of the surface of the dopant-added melt becomes unstable.

In the above aspect, the heating ratio is set larger than 1 (i.e. the volume of heat of the lower heater is set larger than that of the upper heater to enhance the convection that rises from the bottom of the crucible and flows toward the outside of the crucible after reaching the solid-liquid interface. This convection flows in the opposite direction to the direction for convection with an unstable liquid temperature that flows from the surface of the dopant-added melt toward the crystal, thus keeping the melt with an unstable liquid temperature from entering the solid-liquid interface while letting the melt with a relatively stable liquid temperature, which rises from the bottom, flow into the solid-liquid interface. This reduces remelting due to destabilizing the temperature and, consequently, the generation of the remelt growth area A. Thus, no dislocation occurs in the shoulder and the straight body, so that a monocrystalline silicon with a stable quality can be produced.

BRIEF DESCRIPTION OF DRAWING(S)

FIG. 1 schematically shows a remelt growth area.

FIG. 2 schematically shows an arrangement of a monocrystal pull-up apparatus according to an exemplary embodiment of the invention.

FIG. 3 shows production conditions according to the exemplary embodiment.

FIG. 8A is a graph related to Experiment 3 in Examples, showing a temperature variation of the melt surface at a rotation speed of the crucible of 16 rpm.

FIG. 8B is a graph related to Experiment 3 in Examples, showing a temperature variation of the melt surface at a rotation speed of the crucible of 18 rpm.

FIG. 8C is a graph related to Experiment 3 in Examples, showing a temperature variation of the melt surface at a rotation speed of the crucible of 20 rpm.

DESCRIPTION OF EMBODIMENT(S)

Exemplary Embodiment(s)

An Exemplary embodiment of the invention will be described below with reference to the attached drawings.

Arrangement of Monocrystal Pull-Up Apparatus

Figure 2:
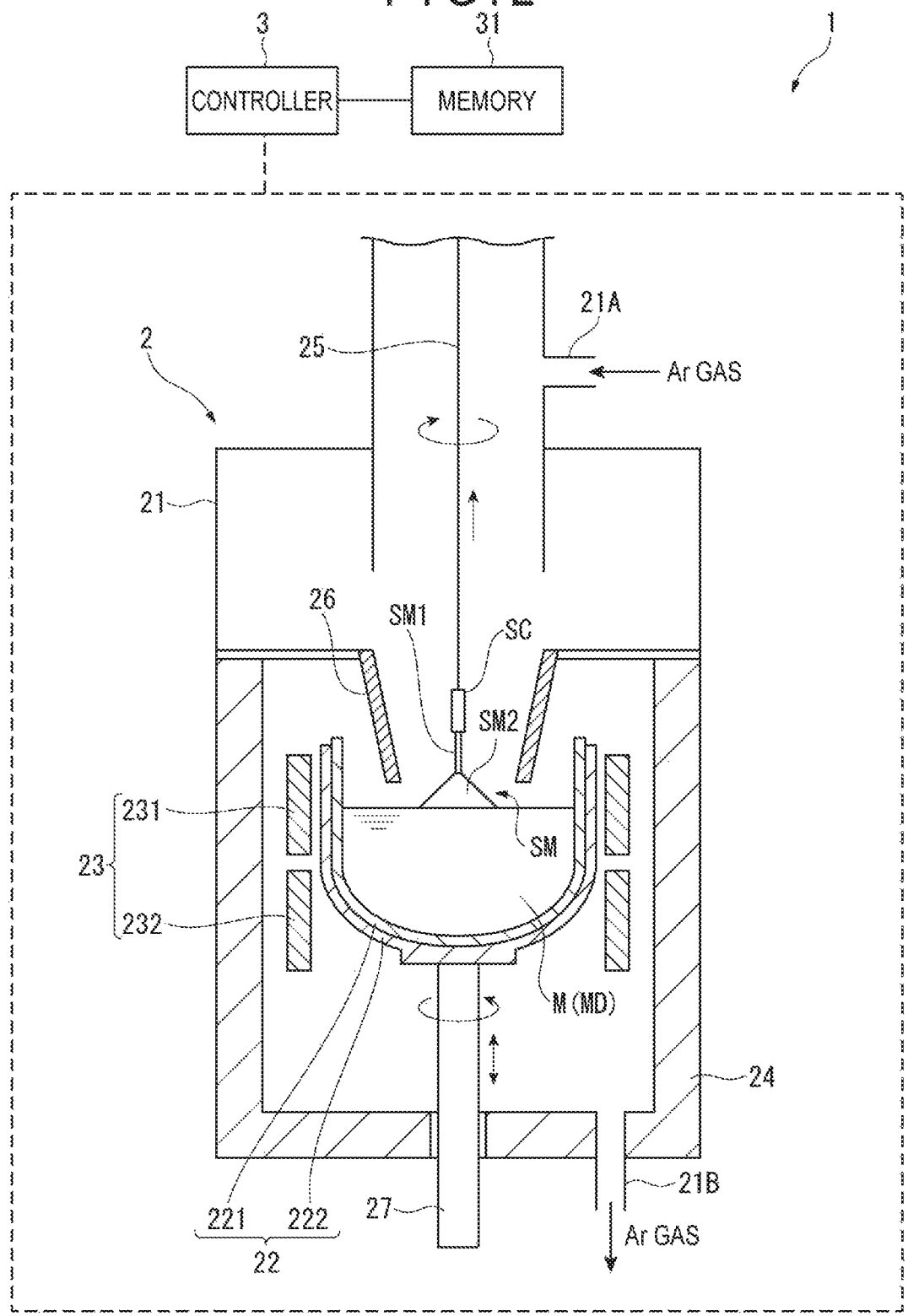

As shown in FIG. 2, a monocrystal pull-up apparatus 1, which is an apparatus usable for the CZ (Czochralski) process, includes a pull-up apparatus body 2 and a controller 3.

The pull-up apparatus body 2 includes a chamber 21, a crucible 22 located at a center in the chamber 21, a heater 23 configured to heat the crucible 22, a heat insulating cylinder 24, a pull-up cable 25 (pull-up unit), and a heat shield 26.

A gas inlet 21A through which an inert gas (e.g. Ar gas) is introduced into the chamber 21 is provided at an upper part of the chamber 21. A gas outlet 21B through which the gas in the chamber 21 is discharged when a vacuum pump (not shown) is driven is provided at a lower part of the chamber 21.

The inert gas is introduced at a predetermined gas flow rate into the chamber 21 through the gas inlet 21A at the upper part of the chamber 21 under the control of the controller 3. The introduced gas is then discharged through the gas outlet 21B at the lower part of the chamber 21 after flowing inside the chamber 21 from the upper side toward the lower side.

A pressure (furnace pressure) inside the chamber 21 is to be controlled by the controller 3.

The crucible 22 is configured to melt polycrystalline silicon (i.e. a material of a silicon wafer) to provide a silicon melt M. The crucible 22 is supported by a support shaft 27 rotatable at a predetermined speed and vertically movable. The crucible 22 includes a cylindrical quartz crucible 221 with a closed bottom and a support crucible 222 made of a carbon material that houses the quartz crucible 221.

The heater 23 is located in the vicinity of the crucible 22 to melt the silicon inside the crucible 22. The heater 23 includes an upper heater 231 configured to heat an upper side surface of the crucible 22 and a lower heater 232, which is located below the upper heater 231, configured to heat a lower side surface of the crucible 22.

The heat insulating cylinder 24 is located around the crucible 22 and the heater 23.

The pull-up cable 25 has a first end connected to a pull-up driver (not shown) located above the crucible 22 and a second end attached with a seed crystal SC. The pull-up cable 25 is vertically movable at a predetermined speed and rotatable around an axis of the pull-up cable 25 as the pull-up drive is controlled by the controller 3.

The heat shield 26 is configured to block radiant heat radiated upward from the heater 23.

The controller 3 is configured to control, for instance, the gas flow rate and the furnace pressure in the chamber 21, the temperature of heat applied to the crucible 22 by the heater 23, and the respective rotation speeds of the crucible 22 and the monocrystalline silicon SM based on, for instance, information stored in a memory 31 and/or an input by an operator to produce the monocrystalline silicon SM.

Production Method of Monocrystalline Silicon

Next, description will be made on a production method of the monocrystalline silicon SM.

It should be noted that a straight body of the monocrystalline silicon SM to be produced exemplarily has a target diameter R of 200 mm in the exemplary embodiment, but the monocrystalline silicon SM with any different target diameter such as 300 mm and 450 mm may be produced.

First, the controller 3 of the monocrystal pull-up apparatus 1 sets production conditions for the monocrystalline silicon SM, such as resistivity, oxygen concentration, Ar flow rate, furnace pressure, respective rotation speeds of the crucible 22 and the monocrystalline silicon SM, and a heating ratio between the upper heater 231 and the lower heater 232. The production conditions may be inputted by an operator or calculated by the controller 3 based on, for instance, a target oxygen concentration inputted by an operator.

The resistivity preferably ranges from 1.5 mΩ·cm to 3.5 mΩ·cm in the use of arsenic as the dopant and preferably from 0.6 mΩ·cm to 1.2 mΩ·cm in the use of red phosphorus as the dopant.

Further, in the exemplary embodiment, the heating ratio is set at 1 (i.e. a heating volume for the upper portion of the crucible 22 is the same as a heating volume for the lower portion) but may be set at any value in a range from 1 to 4. When the heating ratio is less than 1 (i.e. the heating volume for the lower portion is smaller than the heating volume for the upper portion), a convection from the bottom of the crucible 22 toward or below a solid-liquid interface cannot become strong enough to weaken a convection with an unstable liquid temperature from a surface of a dopant-added melt MD toward a crystal, and thus dislocation due to a destabilized temperature cannot be reduced. Meanwhile, when the heating ratio is more than 4, a large heat load on the lower portion of the crucible 22 may cause deformation of the crucible 22 and/or peeling of quartz.

Next, the controller 3 controls the upper heater 231 and the lower heater 232 based on the set value of the heating ratio to heat the crucible 22, thereby melting the polycrystalline silicon material (silicon material) and the dopant in the crucible 22 to produce the dopant-added melt MD. The controller 3 then controls the monocrystal pull-up apparatus 1 to introduce an Ar gas at a predetermined flow rate into the chamber 21 through the gas inlet 21A and reduce the pressure in the chamber 21 so that an inert atmosphere under the reduced pressure is kept in the chamber 21.

The controller 3 then performs a neck-formation step, a shoulder-formation step, a straight-body-formation step and a tail-formation step.

In the neck-formation step, the controller 3 moves the pull-up cable 25 downward to immerse the seed crystal SC into the dopant-added melt MD, and pulls up the pull-up cable 25 while rotating the crucible 22 and the pull-up cable 25 in a predetermined direction, thereby forming a neck SM1. It should be noted that a rotation speed of the crucible 22 for the neck-formation step is preferably the same as the rotation speed at the beginning of the shoulder-formation step.

Figure 1:
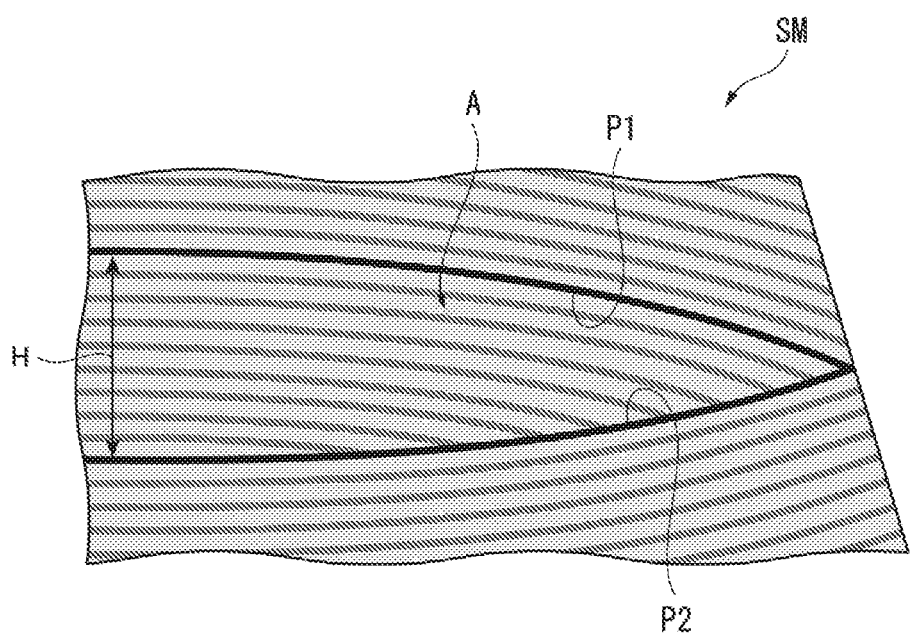

In the shoulder-formation step, a shoulder SM2 is formed in such a manner not to generate the remelt growth area A with the height H of 200 μm or more in the shoulder SM2 as shown in FIG. 1. Specifically, as shown in FIG. 3, the controller 3 pulls up the pull-up cable 25 while rotating the crucible 22 at a rotation speed Sr1 (Sr1≥16 rpm). Sr1 can be set at any value equal to or more than 16 rpm but preferably 30 rpm or less. This is because Sr1 exceeding 30 rpm destabilizes the operation of the monocrystal pull-up apparatus 1 to cause deformation of the shoulder SM2. It should be noted that the abscissa axis in each of FIGS. 3 to 5, 9 and 10 represents a length of the monocrystalline silicon SM excluding the neck SM1.

Subsequently, the rotation speed, which has been maintained at Sr1, starts being gradually reduced at a predetermined timing when a diameter of the pulled monocrystalline silicon SM (shoulder SM2) reaches (½) R (half of the target diameter of the straight body) or more (i.e. the length of the monocrystalline silicon SM reaches L1). Specifically, the rotation speed is linearly reduced such that the rotation speed reaches Sr2, which is suitable for forming the straight body, when the diameter of the monocrystalline silicon SM becomes R (i.e. when the formation of the shoulder SM2 is completed). The heating ratio is maintained at 1 during the shoulder-formation step. It should be noted that Sr2 preferably ranges from 4 rpm to 12 rpm. This is because Sr2 of less than 4 rpm destabilizes the dopant-added melt MD to cause dislocation and Sr2 exceeding 12 rpm increases unevenness of the in-plane distribution of oxygen concentration and resistivity in the monocrystalline silicon SM to destabilize a crystal quality.

Subsequently, the straight-body-formation step and the tail-formation step are performed, thus completing the production of the monocrystalline silicon SM.

Advantage(s) of Exemplary Embodiment(s)

In the exemplary embodiment, the shoulder-formation step is performed in such a manner not to generate the remelt growth area A with the height H of 200 μm or more in the shoulder SM2 to reduce occurrence of dislocation in the shoulder SM2 and, consequently, occurrence of dislocation in the straight body. The monocrystalline silicon SM with a stable quality can thus be produced.

Further, a monocrystalline silicon with less dislocation can be produced simply by rotating the crucible 22 at a rotation speed of 16 rpm or more during the shoulder-formation step.

Further, the rotation speed is maintained at Sr1 until the diameter of the shoulder SM2 reaches (½)R and gradually reduced at the predetermined timing when the diameter reaches (½)R or more, thereby reducing not only the dislocation in the straight body but also the unevenness of, for instance, oxygen concentration distribution and resistivity distribution.

Modification(s)

It should be understood that the scope of the invention is not limited by the above exemplary embodiment, but various improvements and modifications compatible with the invention are possible and, further, specific processes, arrangements and the like in the practice of the invention may be changed as long as an object of the invention is achievable.

Figure 4A:
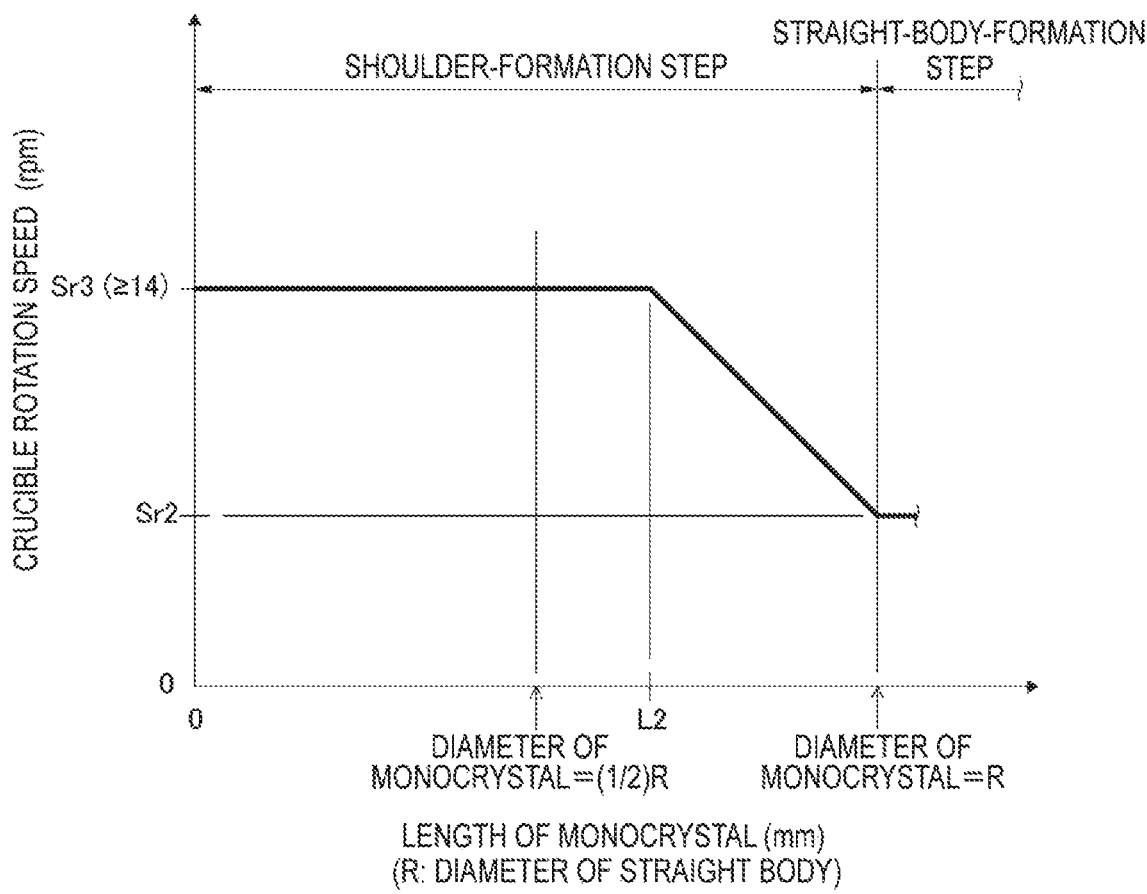
FIG. 4A shows production conditions according to a modification of the invention, in particular, a relationship between a length of a monocrystalline silicon and a rotation speed of a crucible.
Figure 4B:
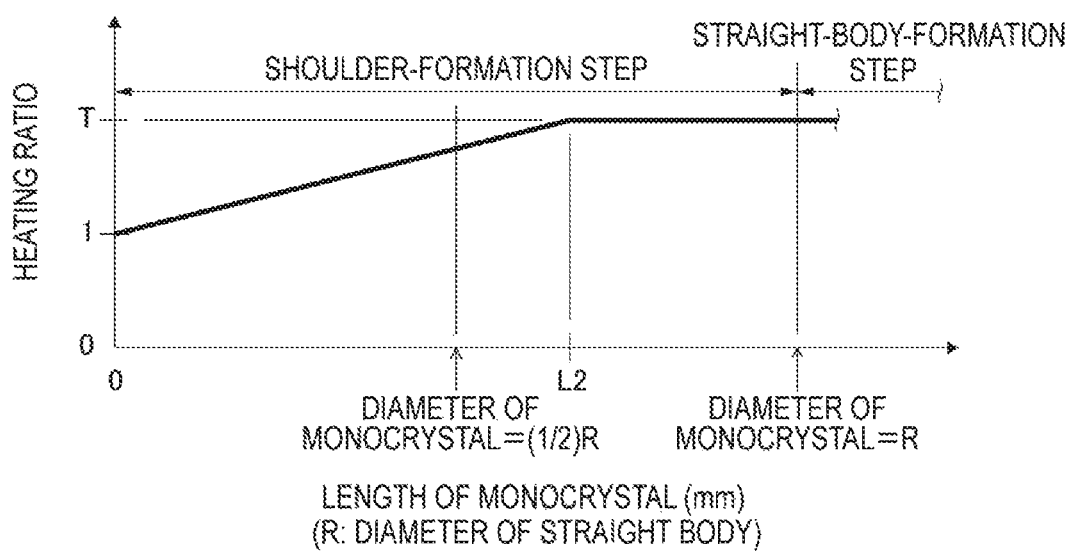
FIG. 4B shows production conditions according to the modification of the invention, in particular, a relationship between the length of the monocrystalline silicon and a heating ratio.

In some exemplary embodiments, the shoulder-formation step is performed, for instance, as shown in FIGS. 4A and 4B.

In this case, the controller 3 sets the heating ratio at a predetermined value equal to or more than 1 ("1" in FIG. 4B) and starts heating the crucible 22. Simultaneously, the pull-up cable 25 is pulled up as the crucible 22 is rotated at Sr3 (Sr3≥14 rpm). Sr3 can be set at any value equal to or more than 14 rpm but preferably 30 rpm or less. This is because Sr3 exceeding 30 rpm destabilizes the operation of the monocrystal pull-up apparatus 1 to cause deformation of the monocrystalline silicon SM.

Subsequently, while the rotation speed is maintained at Sr3, the heating ratio is gradually increased. When the diameter of the monocrystalline silicon SM reaches (½)R or more (i.e. the length of the monocrystalline silicon SM reaches L2) and the heating ratio reaches T, the rotation speed is gradually reduced while the heating ratio is maintained constant. Specifically, the rotation speed is linearly reduced such that Sr2 is reached at the completion of the formation of the shoulder. It should be noted that T preferably ranges from 1.5 to 4. Further, Sr2 preferably ranges from 4 rpm to 12 rpm as described in the above exemplary embodiment.

Subsequently, the straight-body-formation step and the tail-formation step are performed, thus completing the production of the monocrystalline silicon SM.

In such a method, T is controlled as descried above to enhance the convection from the bottom of the crucible 22 toward or below the solid-liquid interface, thus reducing the convection with an unstable liquid temperature from the surface of the dopant-added melt MD toward the crystal. Consequently, the shoulder-formation step can be performed in such a manner not to generate the remelt growth area A with the height H of 200 μm or more in the shoulder, thus producing a monocrystalline silicon with a stable quality.

In the production method shown in FIG. 3 and the production method shown in FIGS. 4A and 4B, the rotation speed for the shoulder-formation step may be maintained at Sr1 and Sr3, respectively.

In the above exemplary embodiment, the rotation speed of the crucible 22 is linearly reduced at and after the predetermined timing and the heating ratio is linearly and gradually increased from the predetermined value equal to or more than 1. However, such linear reduction and increase are merely examples. For instance, the reduction and increase may be non-linear or stepwise.

EXAMPLE(S)

Next, the invention will be described in more detail below with reference to Examples. However, it should be noted that the scope of the invention is by no means limited by these Examples.

Experiment 1: Relationship Between Rotation Speed of Crucible and Dislocation Production Method of Monocrystalline Silicon Comparative Example 1

Figure 5:
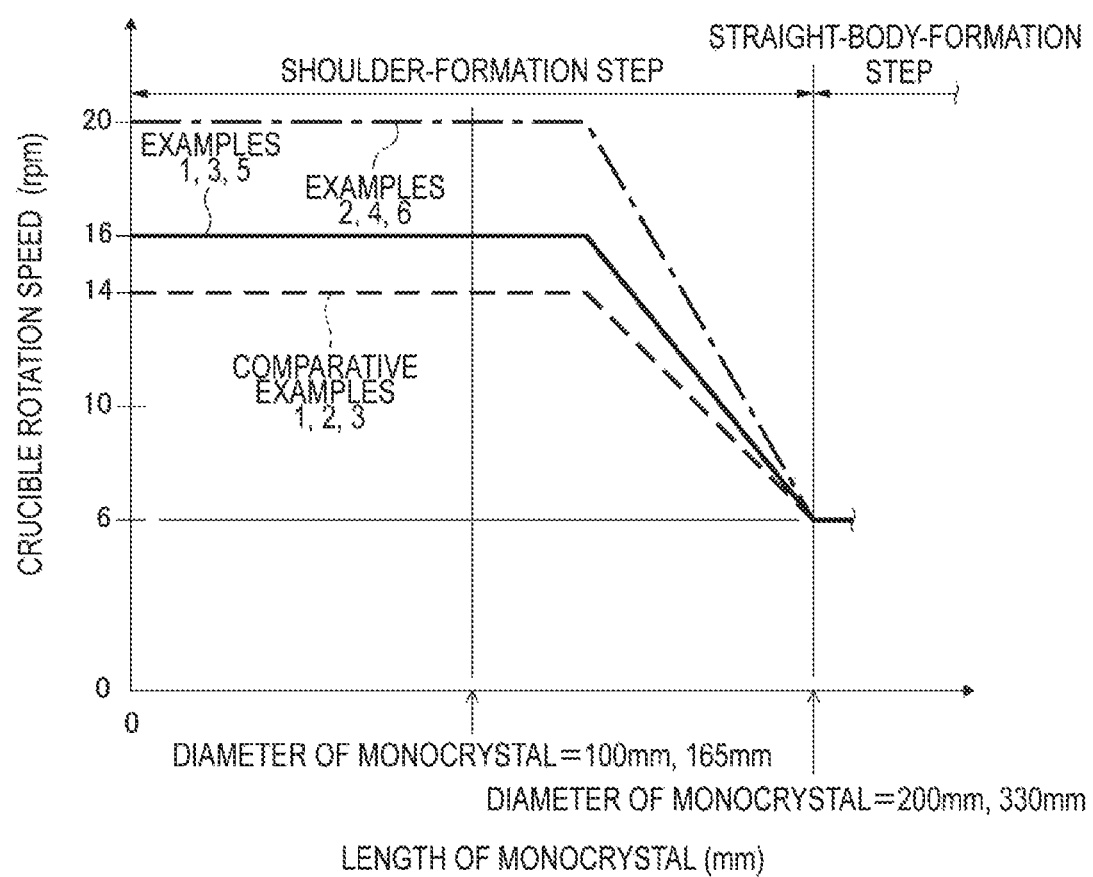
FIG. 5 shows production conditions for Experiment 1 in Examples according to the invention.

As shown in FIG. 5 and Table 1, in the shoulder-formation step, the rotation speed was controlled such that the cable was pulled up with the crucible being rotated at 14 rpm and the rotation speed started being gradually reduced at the timing when the diameter of the monocrystalline silicon became 100 mm (a half of the target diameter of the straight body) or more to reach 6 rpm at the completion of the formation of the shoulder. The heating ratio was set constant at 1. Subsequently, the straight-body-formation step and the tail-formation step were performed. Table 1 shows the target diameter of the straight body, dopant, and resistivity.

In the process of production, the monocrystalline silicon was observed to find whether any dislocation occurred. When dislocation occurred, the pull-up operation was stopped and the monocrystalline silicon was melted in a dopant-added melt (a melt-back step). The above process was then repeated until a monocrystalline silicon including a straight body with no dislocation was produced. Table 1 shows the frequency of pulling up ('try' frequency), the frequency of occurrence of dislocation (dislocation frequency), and the incidence of dislocation (dislocation rate=dislocation frequency/try frequency).

It should be noted that a single monocrystalline silicon with dislocation in the shoulder was kept as a sample for Experiment 2 (later described) without performing the melt-back step.

TABLE 1

|  | Comp. 1 | Ex. 1 | Ex. 2 |
|---|---|---|---|
| Target Diameter of Straight Body | | 200 mm | |
| Dopant | | Arsenic | |
| Resistivity | | 2.0 mΩ · cm | |
| Rotation Speed of Crucible (rpm) | 14→6 | 16→6 | 20→6 |
| Heating Ratio | | 1 | |
| Try Frequency | 6 | 11 | 5 |
| Dislocation Frequency | 4 | 0 | 0 |
| Dislocation Rate | 67% | 0% | 0% |

Examples 1 and 2

Monocrystalline silicons were produced in Examples 1 and 2 under the same conditions as in Comparative Example 1 except that the crucible was rotated respectively at 16 rpm and 20 rpm during the period when the crucible was rotated at 14 rpm in Comparative Example 1. Table 1 shows the try frequency, dislocation frequency, and dislocation rate.

Comparative Examples 2 and 3, Examples 3 to 6

As shown in FIG. 5 and Table 2, a monocrystalline silicon was produced in Comparative Example 2 under the same conditions as in Comparative Example 1 except that, in the shoulder-formation step, the cable was pulled up with the crucible being rotated at 14 rpm, the rotation speed started being reduced at the timing when the diameter of the monocrystalline silicon became 165 mm (a half of the target diameter of the straight body) or more, and the target diameter of the straight body and resistivity were set at values shown in Table 2.

Monocrystalline silicons were produced in Examples 3 and 4 under the same conditions as in Comparative Example 2 except that the crucible was rotated respectively at 16 rpm and 20 rpm during the period when the crucible was rotated at 14 rpm in Comparative Example 2.

As shown in FIG. 5, monocrystalline silicons were produced in Comparative Example 3 and Examples 5 and 6 under the same conditions as in Comparative Example 2 and Examples 3 and 4 except that the dopant and resistivity were chosen as shown in Table 3.

Tables 2 and 3 show the try frequency, dislocation frequency and dislocation rate of each of Comparative Examples 2 and 3 and Examples 3 to 6.

TABLE 2

|  | Comp. 2 | Ex. 3 | Ex. 4 |
| --- | --- | --- | --- |
| Target Diameter of Straight Body |  | 330 mm |  |
| Dopant |  | Arsenic |  |
| Resistivity |  | 2.6 mΩ · cm |  |
| Rotation Speed of Crucible (rpm) | 14→6 | 16→6 | 20→6 |
| Heating Ratio |  | 1 |  |
| Try Frequency | 3 | 2 | 3 |
| Dislocation Frequency | 2 | 0 | 0 |
| Dislocation Rate | 67% | 0% | 0% |

TABLE 3

|  | Comp. 3 | Ex. 5 | Ex. 6 |
| --- | --- | --- | --- |
| Target Diameter of Straight Body |  | 330 mm |  |
| Dopant |  | Red Phosphorus |  |
| Resistivity |  | 1.3 mΩ · cm |  |
| Rotation Speed of Crucible (rpm) | 14→6 | 16→6 | 20→6 |
| Heating Ratio |  | 1 |  |
| Try Frequency | 4 | 2 | 5 |
| Dislocation Frequency | 3 | 0 | 0 |
| Dislocation Rate | 75% | 0% | 0% |

Evaluation

As shown in Tables 1 to 3, dislocation sometimes occurred in the monocrystalline silicons in Comparative Examples 1 to 3, whereas no dislocation occurred in any portion in Examples 1 to 6, This has proven that a monocrystalline silicon with no dislocation including a straight body with a target diameter of 200 mm or more can be produced by setting the rotation speed of the crucible for the shoulder-formation step at 16 rpm or more.

Experiment 2: Relationship Between Dislocation and Height of Remelt Growth Area

The monocrystalline silicon of Comparative Example 1, in which dislocation occurred, was vertically cut at a center in a radial direction and the obtained cross section of the shoulder was observed on X-rays to evaluate the number and the height of the remelt growth area(s). The same evaluation was also performed on the monocrystalline silicons of Examples 1, 2 and 5, in which no dislocation occurred. The results are shown in FIG. 6.

Figure 6:
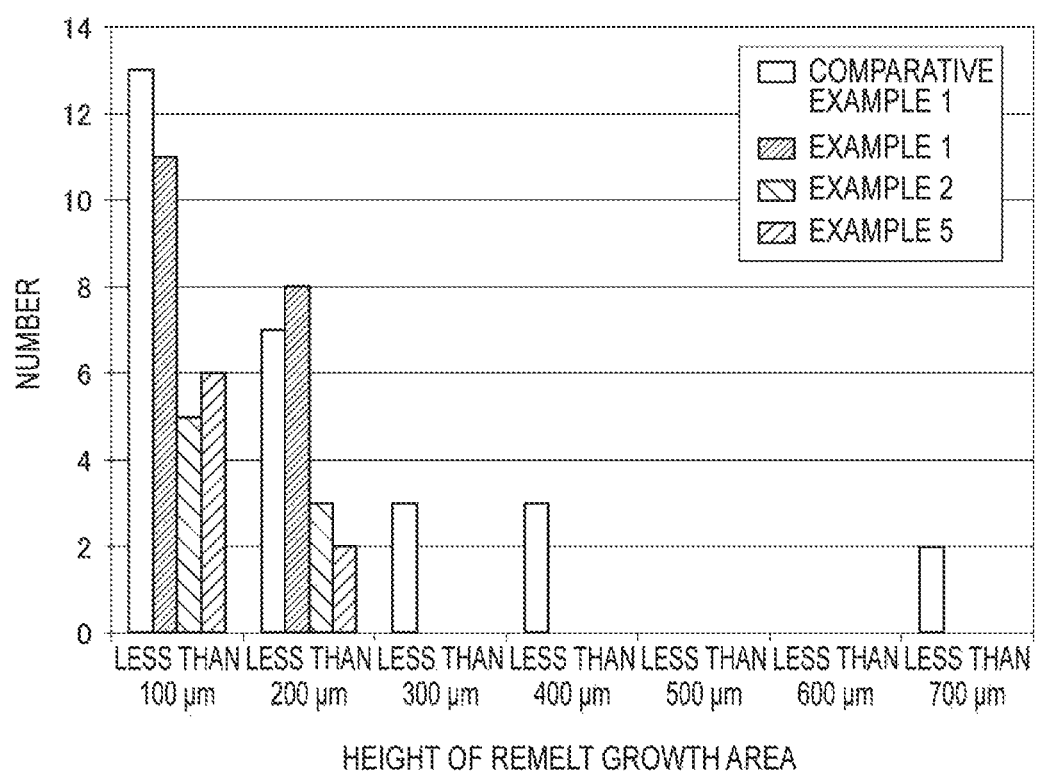
FIG. 6 is a graph related to Experiment 2 in Examples, showing a relationship between the height and the number of the remelt growth area(s).

As shown in FIG. 6, the shoulder of each of Examples 1, 2 and 5 had remelt growth areas of less than 200 μm in height but no remelt growth area of 200 μm or more. In contrast, the shoulder of Comparative Example 1 had not only remelt growth areas of less than 200 μm but also ones of 200 μm or more. Further, since no dislocation occurred in the monocrystalline silicons of Examples 3, 4 and 6, the shoulders of Examples 3, 4 and 6 are supposed to have no remelt growth area of 200 μm or more in height. Additionally, since dislocation occurred in the monocrystalline silicons of Comparative Examples 2 and 3, the shoulders of Comparative Examples 2 and 3 are supposed to have a remelt growth area(s) of 200 μm or more in height.

In view of the above, it have been proven that a monocrystalline silicon with no dislocation can be produced by performing the shoulder-formation step in a manner not to generate a remelt growth area of 200 μm or more in height in the shoulder.

Figure 7A:
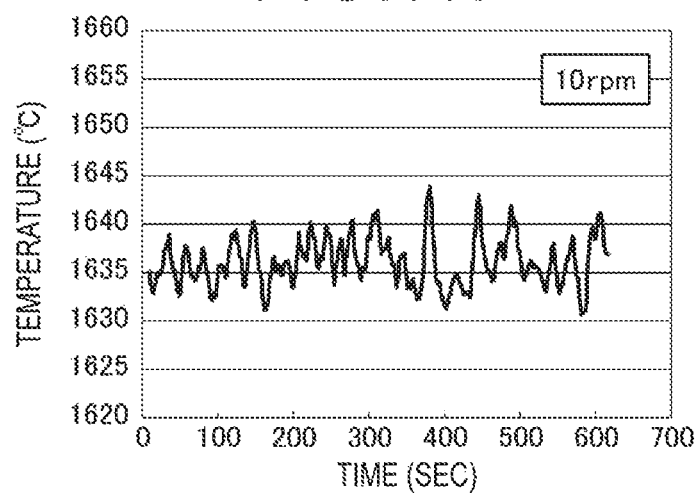
FIG. 7A is a graph related to Experiment 3 in Examples, showing a temperature variation of a melt surface at a rotation speed of the crucible of 10 rpm.
Figure 7B:
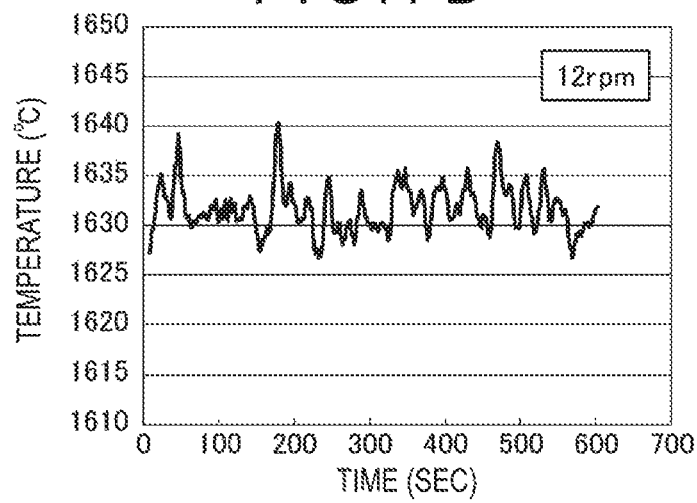
FIG. 7B is a graph related to Experiment 3 in Examples, showing a temperature variation of the melt surface at a rotation speed of the crucible of 12 rpm.
Figure 7C:
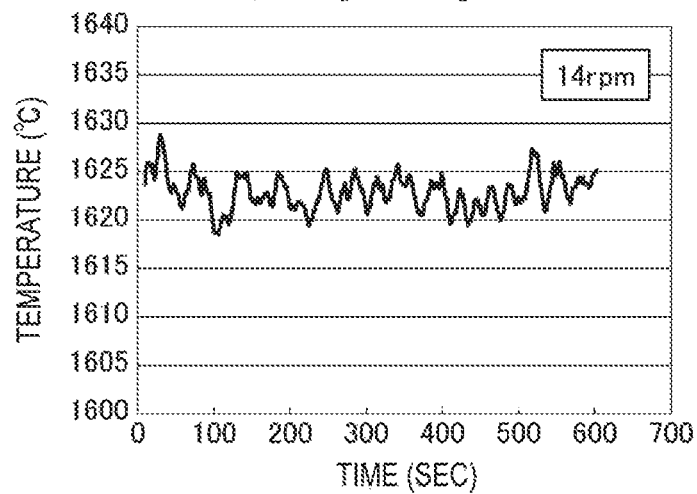
FIG. 7C is a graph related to Experiment 3 in Examples, showing a temperature variation of the melt surface at a rotation speed of the crucible of 14 rpm.

Experiment 3: Relationship Between Rotation Speed of Crucible and Temperature Variation of Melt Surface A dopant-added melt was prepared under the same conditions as in producing a typical monocrystalline silicon. Further, an Ar gas was supplied to a chamber and the pressure was set at 450 Torr (59995 Pa) in the same manner as in producing a typical monocrystalline silicon. The crucible was rotated at 10 rpm and a temperature of a center of a surface of the dopant-added melt was measured with an infrared radiation thermometer. The measurement was performed every second and an average of variations was evaluated per 10 seconds. The results are shown in FIG. 7A.

Similarly, the temperature of the center of the surface of the dopant-added melt was measured and evaluated for each of rotation speeds of 12 rpm, 14 rpm, 16 rpm, 18 rpm, and 20 rpm. The results are shown in FIGS. 7B, 7C, 8A, 8B, and 8C. The standard deviations of the measurement results are shown in Table 4.

TABLE 4

| Rotation Speed of Crucible (rpm) | Standard Deviation |
| --- | --- |
| 10 | 4.15 |
| 12 | 3.87 |
| 14 | 2.99 |
| 16 | 2.51 |
| 18 | 2.14 |
| 20 | 2.03 |

As shown in the figures and Table 4, it has been proven that the temperature variation becomes small with an increase in the rotation speed. This would be because an increase in the rotation speed of the crucible reduces the convection of the dopant-added melt. Thus, an increase in the rotation speed is supposed to reduce remelting resulting from the temperature of the surface of the dopant-added melt becoming unstable, thus producing a monocrystalline silicon with no dislocation.

Experiment 4: Relationship Between Timing for Changing Rotation Speed of Crucible and Dislocation Production Method of Monocrystalline Silicon Comparative Example 4

Figure 9:
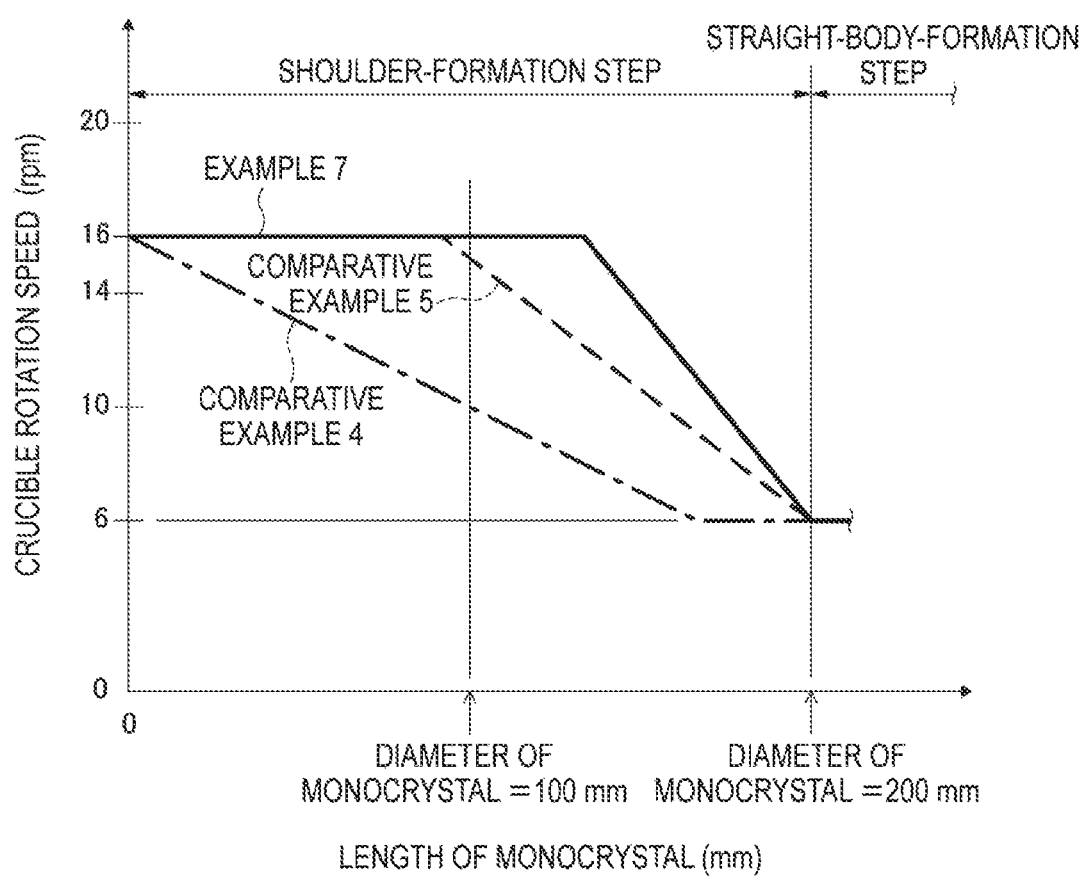
FIG. 9 shows production conditions for Experiment 4 in Examples.

As shown in FIG. 9 and Table 5, in the shoulder-formation step, the rotation speed was controlled such that the cable was pulled up with the crucible being rotated at 16 rpm and the rotation speed started being gradually reduced upon the pull-up operation to reach 6 rpm at the timing when the diameter of the monocrystalline silicon became 100 mm or more. The rotation speed was then maintained at 6 rpm until the completion of the shoulder-formation step. The heating ratio was set constant at 1. Subsequently, the straight-body-formation step and the tail-formation step were performed.

In the process of production, the melt-back step was performed when the monocrystalline silicon had dislocation. The above process was repeated until a monocrystalline silicon including a straight body with no dislocation was produced in the same manner as in Experiment 1. Table 5 shows the dopant, resistivity, try frequency, dislocation frequency, and dislocation rate.

TABLE 5

|  | Comp. 4 | Comp. 5 | Ex. 7 |
| --- | --- | --- | --- |
| Target Diameter of Straight Body |  | 200 mm |  |
| Dopant |  | Arsenic |  |
| Resistivity |  | 2.0 mΩ · cm |  |
| Timing for Changing Rotation Speed of Crucible | <<(1/2)R | <(1/2)R | >(1/2)R |
| Rotation Speed of Crucible (rpm) | 16→6 | 16→6 | 16→6 |
| Heating Ratio | 1 | 1 | 1 |
| Try Frequency | 11 | 5 | 11 |
| Dislocation Frequency | 9 | 3 | 0 |
| Dislocation Rate | 82% | 60% | 0% |

Comparative Example 5, Example 7

A monocrystalline silicon was produced in Comparative Example 5 under the same conditions as in Comparative Example 4 except that, in the shoulder-formation step, the cable was pulled with the crucible being rotated at 16 rpm and the rotation speed started being gradually reduced at the timing when the diameter of the monocrystalline silicon was less than 100 mm to reach 6 rpm at the completion of the formation of the shoulder.

A monocrystalline silicon was produced in Example 7 under the same conditions as in Comparative Example 5 except that the rotation speed of the crucible was changed at the timing when the diameter of the monocrystalline silicon became 100 mm or more. Table 5 shows the try frequency, dislocation frequency, and dislocation rate.

Evaluation

As shown in Table 5, dislocation occurred in the monocrystalline silicons of Comparative Examples 4 and 5, whereas no dislocation occurred in the monocrystalline silicon of Example 7. This has proven that reducing the speed of the crucible at timing when the diameter of the shoulder is less than a half of the target diameter of the straight body is not effective in reducing dislocation, whereas reducing the speed of the crucible at the timing when the diameter reaches the half of the target diameter of the straight body or more is effective in reducing dislocation.

Experiment 5: Relationship Between Rotation Speed of Crucible, Heating Ratio, and Dislocation In Experiment 5, Comparative Example 1 and Example 2 for Experiment 1 and following Examples 8 and 9 were evaluated.

Production Method of Monocrystalline Silicon

Examples 8

Figure 10A:
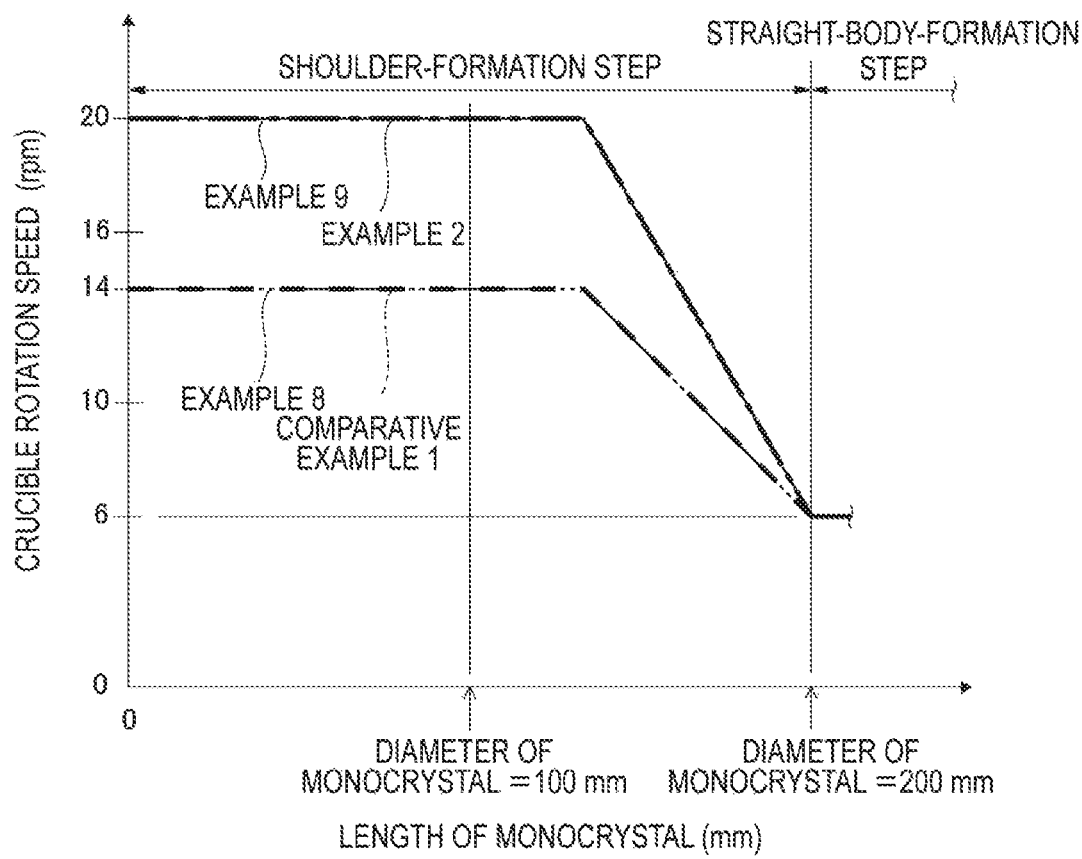
FIG. 10A shows production conditions for Experiment 5 in Examples, in particular, a relationship between the length of the monocrystalline silicon and the rotation speed of the crucible.
Figure 10B:
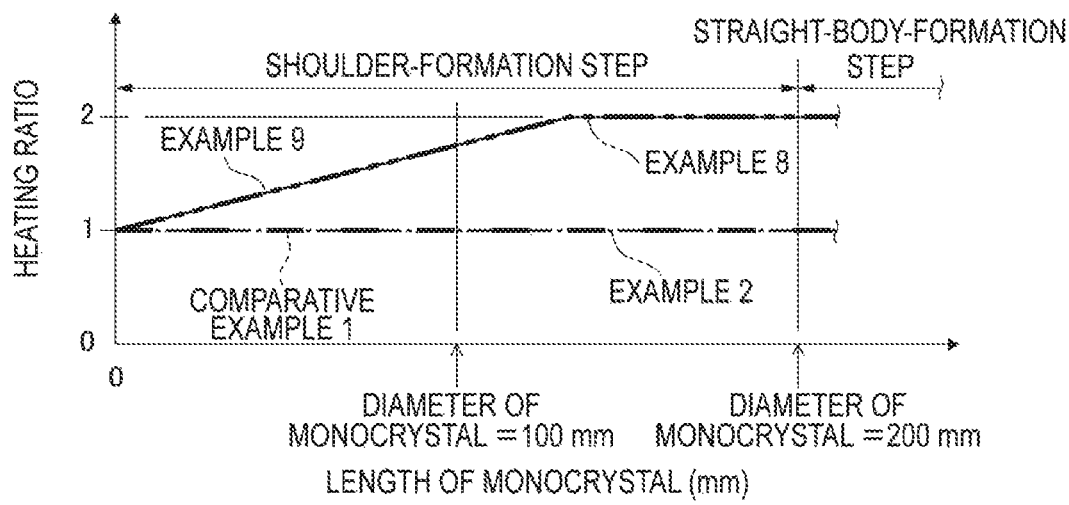
FIG. 10B shows production conditions for Experiment 5 in Examples, in particular, a relationship between the length of the monocrystalline silicon and the heating ratio.

As shown in FIGS. 10A, 10B and Table 6, a monocrystalline silicon was produced under the same conditions as in Comparative Example 1 except that, in the shoulder-formation step, the heating ratio was controlled such that the cable was pulled up with the crucible being heated at a heating ratio of 1, the heating ratio started being gradually increased upon the pull-up operation to reach 2 at the timing when the rotation speed started being reduced, and then the heating ratio was maintained at 2 until the completion of the shoulder-formation step. Table 6 shows the target diameter of the straight body, dopant, resistivity, try frequency, dislocation frequency, and dislocation rate.

TABLE 6

|  | Comp. 1 | Ex. 2 | Ex. 8 | Ex. 9 |
| --- | --- | --- | --- | --- |
| Target Diameter of Straight Body |  | 200 mm |  |  |
| Dopant |  | Arsenic |  |  |
| Resistivity |  | 2.0 mΩ · cm |  |  |
| Rotation Speed of Crucible (rpm) | 14→6 | 20→6 | 14→6 | 20→6 |
| Heating Ratio | 1 | 1 | 1→2 | 1→2 |
| Try Frequency | 6 | 5 | 3 | 20 |
| Dislocation Frequency | 4 | 0 | 0 | 0 |
| Dislocation Rate | 67% | 0% | 0% | 0% |

Example 9

A monocrystalline silicon was produced under the same conditions as in Example 8 except that the rotation speed of the crucible was controlled in the same manner as in Example 2. Table 6 shows the try frequency, dislocation frequency, and dislocation rate.

Evaluation

As shown in Table 6, comparison between Comparative Example 1 and Example 8, in both of which the rotation speed of the crucible was 14 rpm, has proven that dislocation occurs when the heating ratio is maintained at 1, whereas no dislocation occurs when the heating ratio is controlled such that the heating ratio starts being gradually increased from the beginning of the shoulder-formation step to reach 2 at the timing when the diameter of the shoulder becomes a half of the target diameter of the straight body or more and then the heating ratio is maintained at 2 until the completion of the shoulder-formation step. In addition, comparison between Example 2 and Example 9, in both of which the rotation speed of the crucible was 20 rpm, has proven that no dislocation occurs irrespective of whether the heating ratio is maintained at 1 or changed.

Further, in Experiment 1, it has been proven that a monocrystalline silicon of 330 mm in target diameter with no dislocation can be produced using arsenic or red phosphorus as a dopant under the conditions allowing for producing a monocrystalline silicon of 200 mm in target diameter with no dislocation. In view of the above, it is speculated that a monocrystalline silicon of 330 mm in target diameter with no dislocation can be produced using arsenic or red phosphorus as a dopant under the same conditions as in Examples 8 and 9.

Further, it is speculated from the results of Experiment 1 that no remelt growth area with a height of 200 μm or more is generated in the shoulder of each of the monocrystalline silicons of Examples 8 and 9 and the monocrystalline silicons with a target diameter of 330 mm produced using arsenic or red phosphorus as a dopant under the same conditions as in Examples 8 and 9.

Thus, it has been proven that a monocrystalline silicon with no dislocation including a straight body with a target diameter of 200 mm or more can be produced by, in the shoulder-formation step, rotating the crucible at 14 rpm or more until a timing when the diameter of the shoulder reaches a half of the target diameter of the straight body or more while heating the crucible with the heating ratio being increased from 1, and reducing the speed of the crucible after the above timing while the heating ratio is maintained constant.

Experiment 6: Relationship Between Resistivity of Dopant, Rotation Speed of Crucible, and Dislocation In Experiment 6, monocrystalline silicons with the following characteristics were produced and evaluated.
Target diameter of the straight body: 200 mm
Dopant: see Table 7
Resistivity: see Table 7

TABLE 7

|  | Dopant | Resistivity (mΩ · cm) |
| --- | --- | --- |
| Reference Example 1 | Arsenic | 3.0 |
| Reference Example 2 | Arsenic | 1.8 |
| Reference Example 3 | Red Phosphorus | 1.5 |
| Reference Example 4 | Red Phosphorus | 0.7 |

For Reference Examples 1 to 4, the monocrystalline silicons were produced by, in the shoulder-formation step, controlling the rotation speed of the crucible within a range from 6 rpm to 20 rpm as shown in FIG. 10A and the heating ratio within a range from 1 to 2 as shown in FIG. 10B and, subsequently, performing the straight-body-formation step and the tail-formation step.

Figure 11:
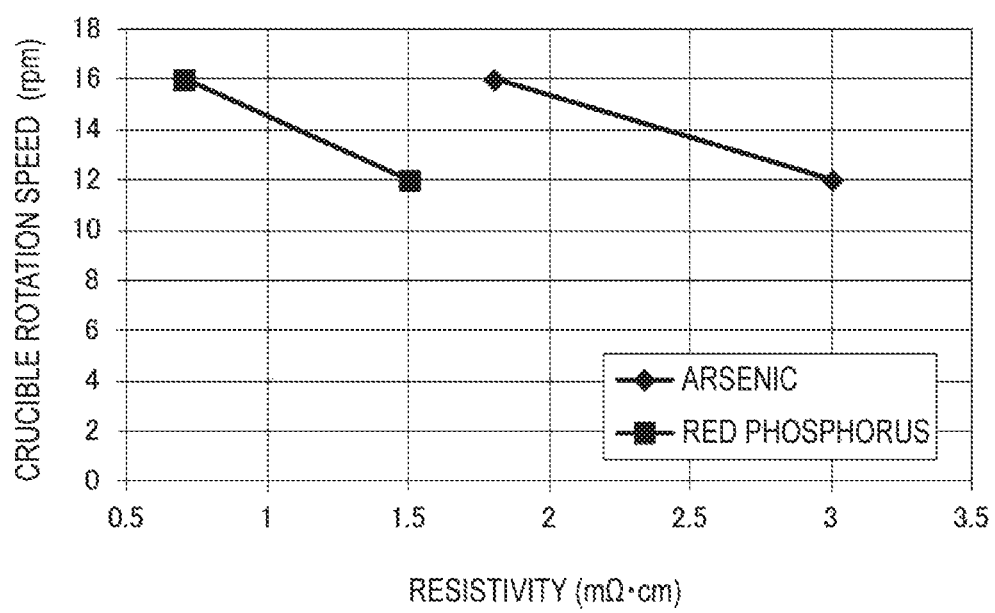
FIG. 11 is a graph related to Experiment 6 in Examples, showing a relationship between resistivity and the rotation speed of the crucible causing no dislocation.

In connection with Reference Examples 1 to 4, FIG. 11 shows a relationship between the minimum rotation speed of the crucible not causing dislocation and the resistivity of the monocrystalline silicon. FIG. 11 shows that rotation speeds above a line representing this relationship cause no dislocation, whereas rotation speeds below the line cause dislocation.

As shown in FIG. 11, it has been demonstrated that the minimum rotation speed of the crucible not causing dislocation increases with a reduction in the resistivity of the monocrystalline silicon.

The invention claimed is:

1. A production method of a monocrystalline silicon according to a Czochralski process with use of a monocrystal pull-up apparatus, the apparatus comprising:
a chamber;
a crucible located in the chamber;
a heater configured to heat the crucible to produce a dopant-added melt comprising a silicon melt and a dopant added to the silicon melt; and
a pull-up unit configured to pull up a seed crystal after bringing the seed crystal into contact with the dopant-added melt, the method comprising:
forming a shoulder of the monocrystalline silicon; and
forming a straight body of the monocrystalline silicon, wherein
in the forming of the shoulder, the shoulder is formed such that a part of growth striations, which extend radially across the shoulder, has an outer end interrupted by another part of the growth striations not to reach a peripheral portion of the shoulder and that no remelt growth area with a height of 200 μm or more in a growth direction is generated.

2. A production method of a monocrystalline silicon according to a Czochralski process with use of a monocrystal pull-up apparatus, the apparatus comprising:
a chamber;
a crucible located in the chamber;
a heater configured to heat the crucible to produce a dopant-added melt comprising a silicon melt and red phosphorus or arsenic added as a dopant to the silicon melt; and
a pull-up unit configured to pull up a seed crystal after bringing the seed crystal into contact with the dopant-added melt, the method comprising:
forming a shoulder of the monocrystalline silicon; and
forming a straight body with a target diameter of 200 mm or more, wherein
in the forming of the shoulder, the crucible is rotated at 16 rpm or more.

3. The production method of the monocrystalline silicon according to claim 2, wherein
in the forming of the shoulder, the crucible is rotated at 16 rpm or more until a timing when a diameter of the shoulder being formed reaches a half of the target diameter of the straight body or more and a rotation speed of the crucible is reduced at or after the timing.

4. A production method of a monocrystalline silicon according to a Czochralski process with use of a monocrystal pull-up apparatus, the apparatus comprising:
a chamber;
a crucible located in the chamber;
a heater configured to produce a dopant-added melt comprising a silicon melt and red phosphorus or arsenic added as a dopant to the silicon melt, the heater comprising an upper heater configured to heat an upper side surface of the crucible and a lower heater configured to heat a lower side surface of the crucible; and
a pull-up unit configured to pull up a seed crystal after bringing the seed crystal into contact with the dopant-added melt, the method comprising:
forming a shoulder of the monocrystalline silicon; and
forming a straight body with a target diameter of 200 mm or more, wherein
in the forming of the shoulder: the crucible is rotated at 14 rpm or more until a timing when a diameter of the shoulder being formed reaches a half of the target diameter of the straight body or more while heating the crucible such that a heating ratio, which is calculated by dividing a volume of heat from the lower heater by a volume of heat from the upper heater, increases from a predetermined value of 1 or more; and a rotation speed of the crucible is reduced at or after the timing while the heating ratio is maintained constant.

\* \* \* \* \*